United States Patent
Tai et al.

(10) Patent No.: US 10,846,521 B2
(45) Date of Patent: Nov. 24, 2020

(54) GESTURE RECOGNITION SYSTEM AND GESTURE RECOGNITION METHOD THEREOF

(71) Applicant: KaiKuTek Inc., Taipei (TW)

(72) Inventors: Tsung-Ming Tai, New Taipei (TW); Yun-Jie Jhang, Taoyuan (TW); Wen-Jyi Hwang, Taipei (TW); Chun-Hsuan Kuo, San Diego, CA (US)

(73) Assignee: KaiKuTek Inc., Taipei (TW)

( * ) Notice: Subject to any disclaimer, the term of this patent is extended or adjusted under 35 U.S.C. 154(b) by 238 days.

(21) Appl. No.: 16/118,399

(22) Filed: Aug. 30, 2018

(65) Prior Publication Data

US 2019/0242975 A1     Aug. 8, 2019

Related U.S. Application Data

(60) Provisional application No. 62/626,147, filed on Feb. 4, 2018.

(51) Int. Cl.
    *G06K 9/00*      (2006.01)
    *G06K 9/62*      (2006.01)
    (Continued)

(52) U.S. Cl.
    CPC ......... *G06K 9/00335* (2013.01); *G01S 7/414* (2013.01); *G01S 7/417* (2013.01);
    (Continued)

(58) Field of Classification Search
    CPC .. G01S 13/584; G01S 13/89; G01S 2007/356; G01S 7/414; G01S 7/417;
    (Continued)

(56) References Cited

U.S. PATENT DOCUMENTS

2008/0251307 A1* 10/2008 Bell ................. B60W 40/064
                                                  180/170
2014/0282224 A1* 9/2014 Pedley ................. G06F 3/0485
                                                  715/784
(Continued)

OTHER PUBLICATIONS

Pavlo Molchanov et al., "Short-Range FMCW Monopulse Radar for Hand-Gesture Sensing", 2015 IEEE Radar Conference (RadarCon), Arlington, VA, 2015, DOI: 10.1109/RADAR.2015.7131232.

*Primary Examiner* — Timothy X Pham
(74) *Attorney, Agent, or Firm* — Hershkovitz & Associates, PLLC; Abe Hershkovitz

(57) ABSTRACT

A gesture recognition system executes a gesture recognition method which includes the following steps: receiving a sensing signal; selecting one of the sensing frames from the sensing signal; generating a sensing map by applying 2D FFT to the selected sensing frame; selecting a cell having a largest amplitude in the sensing map; calculating the velocity of the cell and setting the velocity of the selected sensing frame to be the velocity of the cell; labeling the selected sensing frame as a valid sensing frame if the velocity of the selected sensing frame exceeds a threshold value, otherwise labeling the selected sensing frame as an invalid sensing frame; using all of the sensing maps of the valid sensing frames in the sensing signal as the input data for the neural network of the gesture recognition system and accordingly performing gesture recognition and gesture event classification.

6 Claims, 2 Drawing Sheets

(51) Int. Cl.
| | | |
|---|---|---|
| G01S 13/89 | (2006.01) | |
| G01S 7/41 | (2006.01) | |
| G06K 9/20 | (2006.01) | |
| G06K 9/46 | (2006.01) | |
| G06F 3/01 | (2006.01) | |
| G06F 9/50 | (2006.01) | |
| G01S 13/58 | (2006.01) | |
| G01S 13/50 | (2006.01) | |
| G01S 7/35 | (2006.01) | |
| G06N 20/00 | (2019.01) | |
| G06N 3/08 | (2006.01) | |
| H03B 21/02 | (2006.01) | |
| G06T 7/20 | (2017.01) | |
| G06F 17/18 | (2006.01) | |

(52) U.S. Cl.
CPC ............ G01S 13/584 (2013.01); G01S 13/89 (2013.01); G06F 3/017 (2013.01); G06F 9/5027 (2013.01); G06F 17/18 (2013.01); G06K 9/2018 (2013.01); G06K 9/4628 (2013.01); G06K 9/6215 (2013.01); G06K 9/6256 (2013.01); G06K 9/6259 (2013.01); G06K 9/6262 (2013.01); G06K 9/6267 (2013.01); G06K 9/6271 (2013.01); G06N 3/08 (2013.01); G06N 20/00 (2019.01); G06T 7/20 (2013.01); H03B 21/02 (2013.01); *G01S 7/415* (2013.01); *G01S 13/50* (2013.01); *G01S 2007/356* (2013.01); *G06T 2207/10028* (2013.01); *G06T 2207/20056* (2013.01); *G06T 2207/20081* (2013.01); *G06T 2207/20084* (2013.01)

(58) Field of Classification Search
CPC .......... G01S 13/50; G01S 7/415; G06F 17/18; G06F 3/017; G06F 9/5027; G06K 9/00335; G06K 9/6215; G06K 9/6256; G06K 9/6259; G06K 9/6262; G06K 9/6267; G06K 9/2018; G06K 9/4628; G06K 9/6271; G06N 20/00; G06N 3/08; G06N 3/0445; G06N 3/0454; G06T 2207/10028; G06T 2207/20056; G06T 2207/20081; G06T 2207/20084; G06T 7/20; H03B 21/02
See application file for complete search history.

(56) References Cited

U.S. PATENT DOCUMENTS

| | | | |
|---|---|---|---|
| 2015/0269425 A1* | 9/2015 | Mazurenko | G06K 9/00335 382/103 |
| 2015/0316513 A1* | 11/2015 | Grimard | G01N 29/04 702/103 |
| 2015/0346893 A1* | 12/2015 | Schevin | G06F 3/0488 345/174 |
| 2019/0029636 A1* | 1/2019 | Lee | A61B 5/0044 |
| 2020/0125180 A1* | 4/2020 | Malysa | G06F 3/03 |

* cited by examiner

GESTURE RECOGNITION SYSTEM AND GESTURE RECOGNITION METHOD THEREOF

CROSS REFERENCE TO RELATED APPLICATION(S)

This non-provisional application claims the benefit under 35 U.S.C. § 119(e) to Patent Application No. 62/626,147 filed in the U.S.A. on Feb. 4, 2018, which is hereby incorporated in its entirety by reference into the present application.

BACKGROUND OF THE INVENTION

1. Field of the Invention

The present invention relates to a gesture recognition system, and particularly to a gesture recognition method of the gesture recognition system.

2. Description of the Related Art

Neural networks are commonly adopted by signal recognition modules to perform signal recognition as well as gesture event classification. For example, the recognition module receives a sensing signal of a user's body through the sensors, e.g. optical image sensors or radar ranging sensors, and processes the sensing signal using the neural networks, and determines whether the user's body as a whole or a portion thereof is exercising particular motions, shapes, or gestures. The recognition module then recognizes the motions, shapes, or gestures exercised by the user which may further be classified into various gesture events. Afterwards executable commands or instructions can be associated with corresponding aforesaid gesture events.

One of the conventional gesture recognition systems is the Doppler radar gesture recognition system. The Doppler radar gesture recognition system senses motions, shapes, or gestures exercised by a user and generates a corresponding Range Doppler Image (RDI) which comprises a plurality of cells corresponding to the processed reflected signal from the detected objects, and the Doppler radar gesture recognition system usually uses all the cells of the Range Doppler Image (RDI) as the input gesture data for a neural network so that the neural network may perform gesture recognition and gesture event classification accordingly.

With all of the cells of the Range Doppler Image (RDI) being used as the input gesture data of the neural network, the neural network as well as the Doppler radar gesture recognition system may incur high computation loading by performing gesture recognition and gesture event classification for the input gesture data.

The Doppler radar gesture recognition system may be deployed in a smart device such as a smart phone, a tablet or the like, and the Doppler radar gesture recognition system may use the processor of the smart device to recognize gesture sensing signals and to classify gesture events. And the smart device may execute functions according to the recognized gestures events. For example, the smart device may have to match the recognized user gesture events with preset ones to enable the user to unlock the smart device.

The gesture recognition function is just part of the functions of the smart device, and when the gesture recognition function incurs high computation loading, the normal operations of the smart device will be adversely affected.

Accordingly, the efficiency of the Doppler radar recognition module needs to be further improved.

SUMMARY OF THE INVENTION

An objective of the present invention is to reduce the computation loading of a gesture recognition method and a gesture recognition system. The objective can be achieved by the gesture recognition method which is executed by the gesture recognition system and includes the following steps.

Receive a sensing signal containing a plurality of sensing frames.

Select one sensing frame from the plurality of sensing frames of the sensing signal.

Perform 2D Fast Fourier Transform (FFT) over the selected sensing frame to generate a sensing map containing a plurality of cells each with an amplitude value and a phase value.

Select the cell with the largest amplitude value in the sensing map as the designated cell.

Calculate the velocity of the designated cell.

Set the velocity of the selected sensing frame to be the velocity of the designated cell.

Determine whether the velocity of the selected sensing frame exceeds a threshold value, and if affirmative, label the selected sensing frame as a valid sensing frame.

When all of the sensing frames of the sensing signal have been processed, use all of the sensing maps of the valid sensing frames as the input data for the neural network of the gesture recognition system and perform gesture recognition and gesture event classification accordingly.

Specifically, the sensing unit receives a plurality of incoming reflected radar chirp signals and then accordingly generates a sensing signal output which includes a plurality of sensing frames.

Then, the processing unit receives aforesaid sensing signal from the sensing unit and selects one of the sensing frames of the sensing signal based on a time sequence, and then generates a sensing map based on the selected sensing frame by applying the 2D Fast Fourier Transform (FFT) over the selected sensing frame, wherein the sensing map includes a plurality of cells in 2D array each with an amplitude value and a phase value.

The processing unit selects the cell with the maximum amplitude from the selected sensing frame as the designated cell of the selected sensing frame. Then the velocity of the designated cell is calculated and the velocity of the selected sensing frame is set to be equal to the velocity of the designated cell.

The processing unit then determines whether the velocity of the selected sensing frame exceeds a threshold value. Then, the processing unit labels the selected sensing frame as a valid sensing frame when the frame velocity of the selected sensing frame is greater than the threshold value.

When all of the sensing frames of the sensing signal are processed and labeled, the processing unit loads the neural network from the memory and sets all of the sensing maps of the valid sensing frames of the sensing signal as input data for the neural network to perform gesture recognition and gesture event classification accordingly.

Only the sensing maps of the valid sensing frames will be taken as input data for the neural network, and hence the amount of input data for the neural network to work on is reduced to achieve the purpose of the present invention of reducing the computation loading for the gesture recognition system.

DETAILED DESCRIPTION OF THE INVENTION

These and other aspects of the embodiments herein will be better appreciated and understood when considered in conjunction with the following description and the accompanying drawings.

Figure 1:
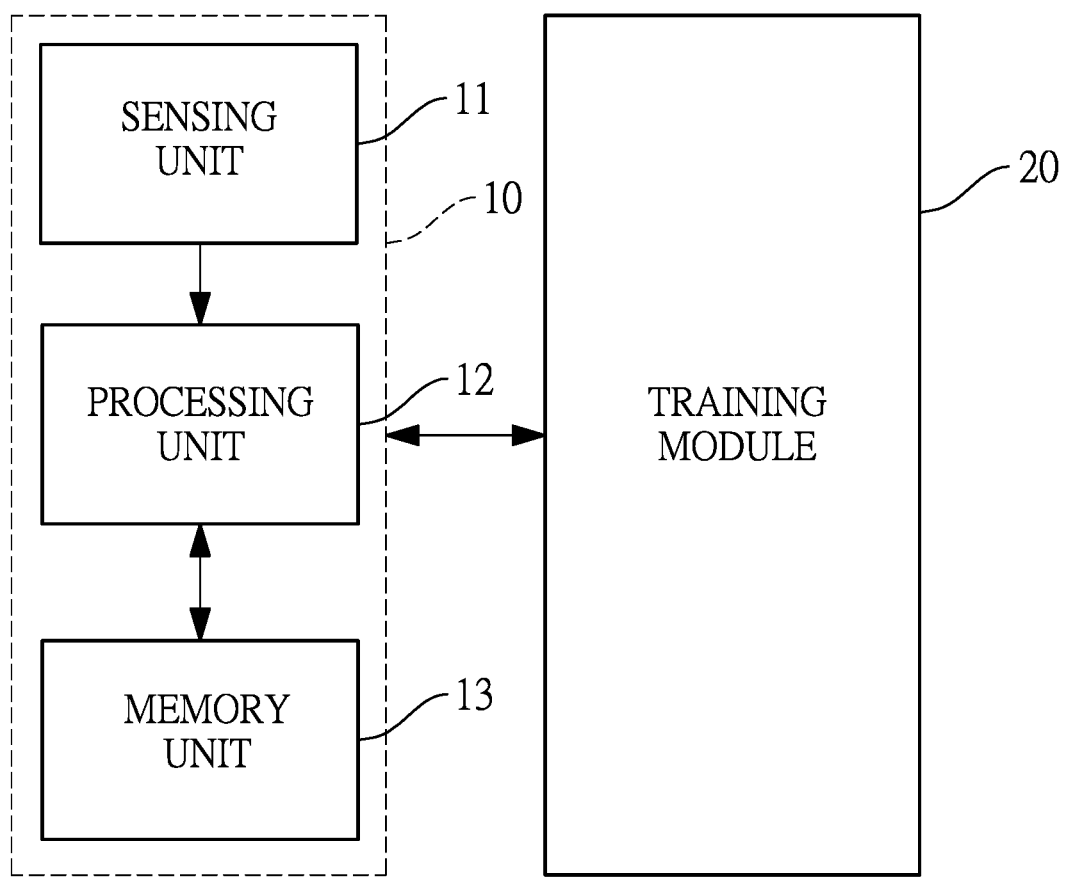
FIG. 1 shows a block diagram of an embodiment of the gesture recognition system of the present invention.

With reference to FIG. 1, the gesture recognition system includes an execution module 10 which further includes a sensing unit 11, a processing unit 12, and a memory unit 13. The processing unit 12 is electrically connected to both the sensing unit 11 and the memory unit 13.

The sensing unit 11 receives a plurality of incoming reflected radar chirp signals and then accordingly generates a sensing signal output which includes a plurality of sensing frames each having a plurality of IF (Intermediate Frequency) signals generated from processing the plurality of corresponding incoming reflected radar chirp signals.

The processing unit 12 receives aforesaid sensing signal from the sensing unit 11 and selects one sensing frame from the plurality of sensing frames of the sensing signal based on a time sequence, and then generates a sensing map based on the selected sensing frame by applying the 2D Fast Fourier Transform (FFT) over the selected sensing frame, wherein the sensing map includes a plurality of cells in 2D array each with an amplitude value and a phase value. For example, the type of the sensing map is Range Doppler Image (RDI).

The processing unit 12 selects the cell with the maximum amplitude from the selected sensing frame as the designated cell of the selected sensing frame.

Then the velocity of the designated cell is calculated based on the phase difference between the designated cell and its chirp related neighboring cell.

Thereafter, the velocity of the selected sensing frame is set to be equal to the velocity of the designated cell.

The processing unit 12 then determines whether the velocity of the selected sensing frame exceeds a threshold value.

Afterwards, the processing unit 12 labels the selected sensing frame as a valid sensing frame when the frame velocity of the selected sensing frame is greater than the threshold value, whereas the selected sensing frame is labeled as an invalid sensing frame when its frame velocity is less than or equal to the threshold value.

When all of the sensing frames of the sensing signal are properly processed and labeled, the processing unit 12 loads the neural network from the memory 13 where the neural network is stored, and sets all of the sensing maps of the valid sensing frames of the sensing signal as input data for the neural network to perform gesture recognition and gesture event classification accordingly.

Since only the sensing maps of the valid sensing frames will be taken as input data for the neural network with the sensing maps of the invalid sensing frames being discarded, the amount of input data for the neural network to work on is significantly reduced, and as a result of such reduction, precious computation resources are saved such that the purpose of the present invention of reducing the computation loading for the gesture recognition system can be achieved thereby.

The discarding of the invalid sensing frames as input to the neural network is well justified because sensing frames with faster moving objects tend to indicate a potential gesture input from the user, whereas sensing frames with much slower moving objects or still objects tend to indicate the user is not exercising a gesture and the like.

As a result of the above, when a central processing unit of a smart device, such as a smart phone, a tablet, or a computer is adopted to be the processing unit 12 of the gesture recognition system, the gesture recognition function of the present invention may have much less adverse influence on the performance of the smart device. Therefore, the gesture recognition system of the present invention should be well suited for integration with the smart device.

Figure 2:
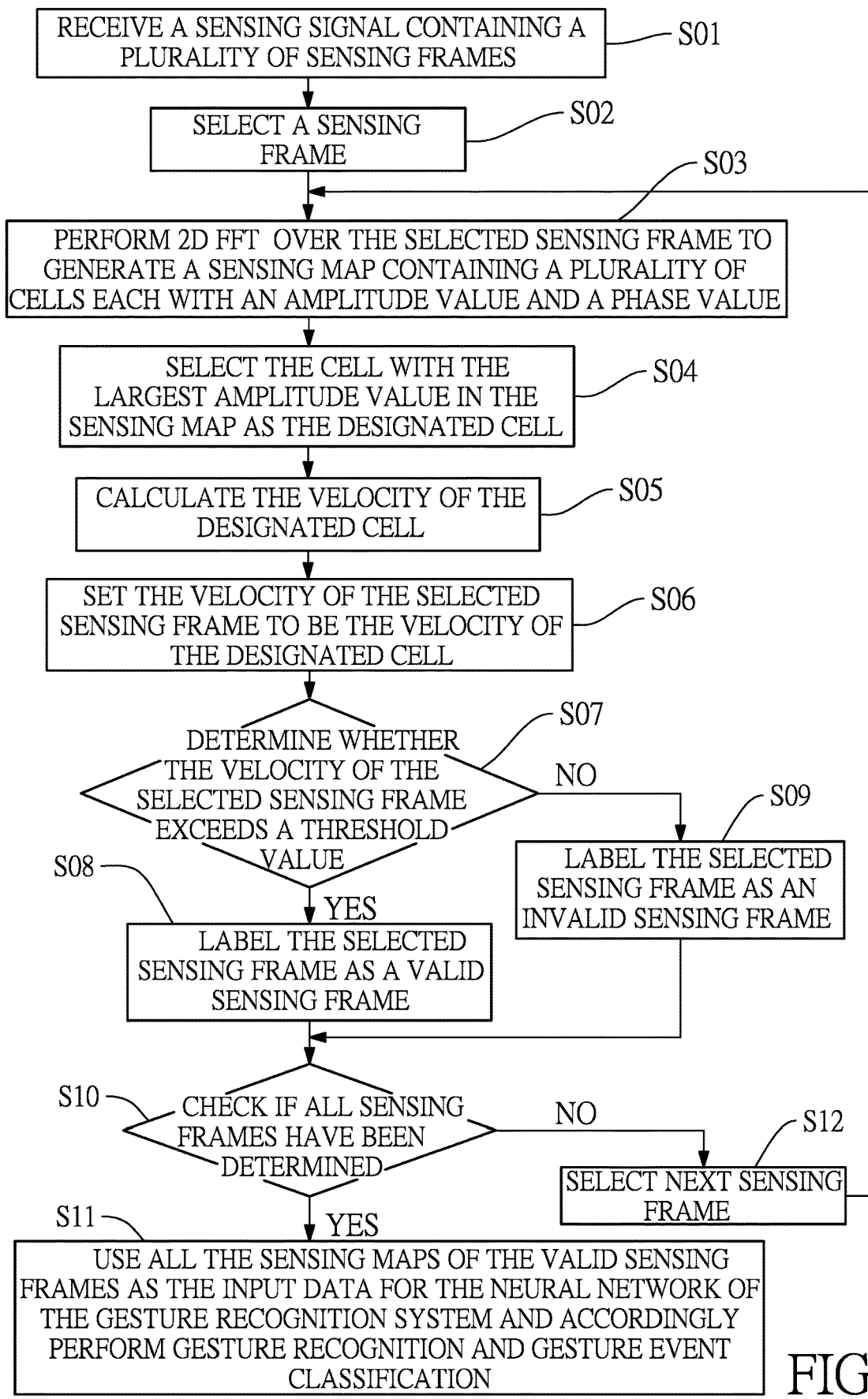
FIG. 2 shows a flowchart of a first embodiment of the gesture recognition method of the gesture recognition system of the present invention.

With reference to FIG. 2, a first embodiment of the gesture recognition method of the gesture recognition system of the present invention to reduce computation loading of the neural network includes the following steps.

(S01): Receive a sensing signal containing a plurality of sensing frames.

(S02): Select a sensing frame.

(S03): Perform 2D FFT (2 dimensional Fast Fourier Transform) over the selected sensing frame to generate a sensing map containing a plurality of cells each with an amplitude value and a phase value.

(S04): Select the cell with the largest amplitude value in the sensing map as the designated cell.

(S05): Calculate the velocity of the designated cell.

(S06): Set the velocity of the selected sensing frame to be the velocity of the designated cell.

(S07): Determine whether the velocity of the selected sensing frame exceeds a threshold value.

(S08): If (S07) is affirmative, label the selected sensing frame as a valid sensing frame.

(S09): If (S07) is negative, label the selected sensing frame as an invalid sensing frame.

(S10): Check if all the sensing frames have been determined.

(S11): If (S10) is affirmative, use all the sensing maps of the valid sensing frames as the input data for the neural network of the gesture recognition system and accordingly perform gesture recognition and gesture event classification.

(S12): If (S10) is negative, select next sensing frame.

In the above-mentioned first embodiment, the types of the neural networks suitable for this invention are, for example, convolutional neural network (CNN), recurrent neural network (RNN), Long Short Memory (LSTM), Gated Recurrent Unit (GRU), Simple Gated Unit (SGU), or a Minimal Gated Unit (MGU) or hybrids of the above-mentioned neural networks.

With reference to FIG. 2, the gesture recognition system further includes a training module 20 electrically connected to the execution module 10 to execute the steps of the gesture recognition method described above in (S01) to (S12) for training purposes.

For example, the training module 20 stores a training neural network, and receives a training signal from the sensing unit 11 of the execution module 10. The training signal comprises a plurality of training frames which are used to train the training neural network according to the steps of the gesture recognition method described above in (S01) to (S12) to achieve beyond a preset success rate of gesture recognition and gesture event classification. When the training process is completed, the well qualified training neural network can be put to work by storing it in the memory unit 13 as an alternative neural network for the gesture recognition system.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A gesture recognition method comprising:
   receiving a plurality of incoming reflected Doppler radar chirp signals to generate a sensing signal which includes a plurality of sensing frames each having a plurality of intermediate frequency (IF) signals;
   selecting one sensing frame from the plurality of sensing frames of the sensing signal;
   generating a sensing map which is of the range Doppler image (RDI) type, based on the selected sensing frame, wherein the sensing map is generated by applying the 2D Fast Fourier Transform (FFT) over the selected sensing frame, and the sensing map contains a plurality of cells each with an amplitude value and a phase value;
   selecting the cell with the largest amplitude value in the sensing map as a designated cell;
   calculating a velocity of the designated cell, wherein the velocity of the designated cell is calculated based on the phase difference between the designated cell and its chirp related neighboring cell;
   setting a velocity of the selected sensing frame to be the velocity of the designated cell;
   determining whether the velocity of the selected sensing frame exceeds a threshold value, and if the velocity of the selected sensing frame exceeds the threshold value, labeling the selected sensing frame as a valid sensing frame;
   when all of the sensing frames of the sensing signal have been determined, using all of the sensing maps of the valid sensing frames as input data for a neural network of a gesture recognition system and performing gesture recognition or gesture event classification accordingly.

2. The gesture recognition method as claimed in claim 1, wherein the neural network is a recurrent neural network (RNN).

3. The gesture recognition method as claimed in claim 2, wherein the recurrent neural network is a Long Short Memory (LSTM) network, a Gated Recurrent Unit (GRU), a Simple Gated Unit (SGU), a Minimal Gated Unit (MGU), or hybrids thereof.

4. A gesture recognition system, comprising:
   a sensing unit comprising a Doppler radar ranging sensor, receiving a plurality of incoming reflected Doppler radar chirp signals with which to generate a sensing signal output which includes a plurality of sensing frames each having a plurality of intermediate frequency (IF) signals;
   a memory unit to store a recurrent neural network (RNN);
   a processing unit comprising a processor of a smart device, electrically connected to the sensing unit and the memory unit, to receive the sensing signal output from the sensing unit;
   wherein the processing unit selects one sensing frame from the plurality of sensing frames of the sensing signal, and generates a sensing map which is of the range Doppler image (RDI) type, based on the selected sensing frame;
   wherein the sensing map is generated by applying the 2D Fast Fourier Transform (FFT) over the selected sensing frame, and the sensing map comprises a plurality of cells in 2D array each with an amplitude value and a phase value;
   wherein the processing unit selects the cell with the maximum amplitude from the selected sensing frame as a designated cell, calculates a velocity of the designated cell, and sets a velocity of the selected sensing frame to be equal to the velocity of the designated cell, wherein the velocity of the designated cell is calculated based on the phase difference between the designated cell and its chirp related neighboring cell;
   wherein the processing unit further determines whether the velocity of the selected sensing frame exceeds a threshold value, and if the velocity of the selected sensing frame exceeds the threshold value, the selected sensing frame is labeled as a valid sensing frame;
   wherein when all of the sensing frames of the sensing signal have been determined by the processing unit, the processing unit loads the neural network from the memory unit and uses all of the sensing maps of the valid sensing frames as input data for the neural network and performs gesture recognition or gesture event classification accordingly.

5. The gesture recognition system as claimed in claim 4, wherein the recurrent neural network is a Long Short Memory (LSTM) network, a Gated Recurrent Unit (GRU), a Simple Gated Unit (SGU), a Minimal Gated Unit (MGU), or hybrids thereof.

6. The gesture recognition system as claimed in claim 4, wherein the gesture recognition system further comprises a training module electrically connected to the sensing unit, the processing unit, and the memory unit; wherein the training module stores a training neural network, and receives a training signal comprising a plurality of training frames from the sensing unit with which the training module trains the training neural network accordingly to achieve beyond a preset success rate of gesture recognition and gesture event classification and then the training neural network is stored in the memory unit as an alternative neural network for the gesture recognition system.

* * * * *